US006380768B2

(12) United States Patent
Ishida

(10) Patent No.: US 6,380,768 B2
(45) Date of Patent: Apr. 30, 2002

(54) DISPLAY DEVICE CAPABLE OF COLLECTING SUBSTANTIALLY ALL POWER CHARGED TO CAPACITIVE LOAD IN DISPLAY PANEL

(75) Inventor: Tatsuya Ishida, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/725,245

(22) Filed: Nov. 29, 2000

(30) Foreign Application Priority Data

Nov. 29, 1999 (JP) .......................................... 11-337791

(51) Int. Cl.[7] .......................... H03B 1/00; G02F 1/1343
(52) U.S. Cl. .......................... 327/111; 349/38; 327/537
(58) Field of Search ................................ 327/108, 109, 327/111, 427, 433, 534, 535, 537, 440, 382, 383, 389, 390; 365/204; 349/38, 39, 54

(56) References Cited

U.S. PATENT DOCUMENTS 4,677,317 A * 6/1987 Sakuma ....................... 326/81
5,623,279 A 4/1997 Itakura et al. ................ 345/98
5,808,706 A * 9/1998 Bae ............................ 349/38
5,940,059 A * 8/1999 Lee et al. ..................... 345/91
6,011,355 A 1/2000 Nagai ...................... 315/167.3
6,040,827 A 3/2000 Shiina et al. ............... 345/208
6,256,076 B1 * 7/2001 Bae et al. ..................... 349/38

FOREIGN PATENT DOCUMENTS

| | | |
|---|---|---|
| EP | 829846 | 3/1998 |
| JP | 2235092 | 9/1990 |
| JP | 10026952 | 1/1998 |
| JP | A10335726 | 12/1998 |
| JP | 11085099 | 3/1999 |

* cited by examiner

*Primary Examiner*—My-Trang Nuton

(57) ABSTRACT

There is provided a display device composed of a display panel having a capacitive load such as an ELDP and a PDP and a semiconductor device for driving the capacitive load which can reliably operate, collect substantially all the power charged to the capacitive load irrespective of the current amplification factor of a parasitic bipolar transistor. The semiconductor device has a high potential side power terminal, low potential side power terminal, power charge/discharge terminal and an output terminal to which a capacitive load is connected. The semiconductor device also includes a first p-channel MOS transistor in which the source is connected to the power charge/discharge terminal, the drain is connected to the output terminal and the back-gate is connected to the high potential side power terminal and a first control signal C1 indicating that the first P-channel MOS transistor should be in ON state during an output period is applied to a gate.

6 Claims, 12 Drawing Sheets

VOLTAGE WAVEFORM OF HIGH POTENTIAL SIDE POWER TERMINAL

VOLTAGE WAVEFORM OF POWER CHARGE / DISCHARGE TERMINAL

LOGIC STATE OF CONTROL SIGNAL C1

LOGIC STATE OF CONTROL SIGNAL C2

LOGIC STATE OF i-TH OUTPUT

OUTPUT VOLTAGE OF i-TH OUTPUT

OUTPUT CURRENT OF i-TH OUTPUT
70V
0
70V
0
H
L
H
L
ON
L
70V
0
70mA
0
100mA
50
51
52
53
55
56
57
58
0
50
100
150
TIME (μs)

5
3
12
100
6
66
11
104
102
101
C1
C2
C3
103
63
65
64
67
7
8
9
1
62E

Fig.9A VOLTAGE WAVEFORM OF HIGH POTENTIAL SIDE POWER TERMINAL
Fig.9B VOLTAGE WAVEFORM OF POWER CHARGE/ DISCHARGE TERMINAL
Fig.9C LOGIC STATE OF CONTROL SIGNAL C1
Fig.9D LOGIC STATE OF CONTROL SIGNAL C2
Fig.9E LOGIC STATE OF CONTROL SIGNAL C3
Fig.9F LOGIC STATE OF i-TH OUTPUT
Fig.9G OUTPUT VOLTAGE OF i-TH OUTPUT
Fig.9H OUTPUT CURRENT OF i-TH OUTPUT
70V
0
70V
0
H
L
H
L
H
L
ON
L
70V
0
70mA
0
100mA
50
51
52
53
55
56
57
58
0
50
100
150
TIME (μs)

DISPLAY DEVICE CAPABLE OF COLLECTING SUBSTANTIALLY ALL POWER CHARGED TO CAPACITIVE LOAD IN DISPLAY PANEL

BACKGROUND OF THE INVENTION

The present invention relates to a display device. More specifically, the present invention relates to a display device provided with a display panel having a capacitive load such as an electroluminescent display panel (hereinafter, referred to as ELDP) or a plasma display panel (hereinafter, referred to as PDP), in which an electric field is generated to emit light, as well as a semiconductor device for driving the capacitive load.

A known display device of this type is exemplified in FIG. 10. The ELDP 1 to be driven has electrodes 8, 9 arranged in a grid at the same intervals both in the vertical and horizontal directions. Each intersection point of the electrodes 8 and 9 constitutes a pixel, which is inevitably parasitized by large capacitance 7 due to the principle of the ELDP or PDP that light is emitted by generating high electric fields between the electrodes 8 in the vertical direction and the electrodes 9 in the horizontal direction. In a driving semiconductor device 2, a few tens of high voltage CMOS (Complementary Metal Oxide Semiconductor) circuits 10 are arranged in an array to constitute output stages on a semiconductor chip. The logic state of these high voltage CMOS circuits 10 is controlled by a low voltage CMOS control circuit such as a shift register circuit or latch circuit mounted on the same chip although it is not shown in the figure. In this driving semiconductor device 2, a low potential side power terminal 11 is connected to the ground potential 12 and the power charge/discharge terminal 6 is connected to the output part of the power supply voltage control circuit 3 (composed of high voltage CMOS circuits). It is noted that the low potential side power supply of the power supply voltage control circuit 3 is connected to the ground potential 12 and the high potential side power supply is connected to a constant voltage power supply 5 of 70 V. There is provided a circuit for collecting power in the power supply voltage control circuit 3 in practice although it is not shown in the figure.

FIG. 11 shows a cross-sectional structure of an output-stage CMOS circuit in the driving semiconductor device (designated by reference numeral 2 in FIG. 10). An n-type epitaxial layer 22 is formed on a p-type semiconductor substrate 20. A high voltage n-channel MOS (hereinafter, referred to as NMOS) transistor 39 and a high voltage p-channel MOS (hereinafter, referred to as PMOS) transistor 40 are formed on this n-type epitaxial layer 22. These NMOS transistor 39 and PMOS transistor 40 are electrically isolated by a diffused p-type insulating isolation layer 21 between the surface of the n-type epitaxial layer 22 and the p-type semiconductor substrate 20. It is noted that a low voltage CMOS control circuit is also formed on the same semiconductor substrate 20 in a state that it is electrically isolated by the p-type insulating isolation layer 21 although it is not shown in the figure. The NMOS transistor 39 has a VDMOS (Vertical Double Diffused Metal Oxide Semiconductor) structure and is provided with a p-type base diffusion layer 35, gate electrode 32, source electrode 30 and drain electrode 29. It is noted that the drain current of the NMOS transistor 39 is drawn by a high-concentration n-type buried diffusion layer 23 and a high-concentration n-type drawing diffusion layer 25. 33 denotes an oxide film and 38 denotes a surface insulating film. The PMOS transistor 40 has a horizontal-type structure containing a p-type drain diffusion layer 34 for a high voltage specification and is provided with a gate electrode 31, source electrode 27 and drain electrode 26. Since the n-type epitaxial layer 22 and the p-type semiconductor substrate 20 are disposed vertically corresponding to the p-type drain diffusion layer 34 beneath this PMOS transistor 40, a parasitic bipolar transistor 4 (also shown in FIG. 10) is generated as shown in the figure. In order to keep the current amplification factor hFE of this parasitic bipolar transistor 4 low, a high-concentration n-type buried diffusion layer 23 is formed below the p-type drain diffusion layer 34 as well. Consequently, the current amplification factor hFE of the parasitic bipolar transistor 4 is reduced to about 0.05 or less.

FIGS. 12A, 12B, 12C and 12D show waveforms of respective parts in the driving semiconductor device 2. A periodic rectangular wave 50 is applied to the power charge/discharge terminal 6 by the power supply voltage control circuit 3. The voltage (see FIG. 12C) of the i-th output terminal (exemplified by the one with reference numeral 14 for convenience) out of output terminals 13, 14, 15, 16 is controlled by the periodic rectangular wave 50 (see FIG. 12A) applied to the power charge/discharge terminal 6 and the logic state 51 (see FIG. 12B) of the i-th output CMOS circuit 10 determined by image information (an H level represents an output; an L level represents a halt) and has a waveform 52 (see FIG. 12C) showing rises and falls representing integration due to the capacitive load. In FIG. 12C, 55 represents charge to the load and 56 represents discharge from the load. In FIG. 12D, 53 is a current waveform in the i-th output terminal 14. The positive direction represents output from the output terminal. 57 is charge current to the electrode 8 in the vertical direction corresponding to the i-th output terminal 14. The charge current 57 during a charge process 55 flows through the path shown as 17 in FIG. 10, that is, flows from the high-voltage constant voltage power supply 5 of 70 V through the power charge/discharge terminal 6, the PMOS transistor 40 in the ON state and the i-th output terminal 14 and charges the electrode 8 in the vertical direction. On the other hand, the discharge current 58 is returned through the path shown as 18 in FIG. 10 during a discharge process 56, that is, to the high-voltage constant voltage power supply 5 side through the path in the direction reverse to that of the charge process 55. This is because the voltage 50 (see FIG. 12A) applied to the power charge/discharge terminal 6 drops from 70 V to 0 V rapidly while the logic state 51 of the i-th output CMOS circuit is maintained at the H level. If the discharge current is returned to the high-voltage constant voltage power supply 5, the power accumulated in the capacitive component of the load can be collected. Thus, power consumption in the ELDP can be reduced. However, since a current path 61 flowing to the ground side 12 is generated by the parasitic bipolar transistor 4 during the discharge process 56, the power collection efficiency decreases. The ratio (i1/i2) of the current component i1 that can collect power by returning this discharge current to the high-voltage constant voltage power supply 5 and the current component i2 that cannot return the discharge current to the high-voltage constant voltage power supply 5, thereby being unable to collect power, is expressed by $$i1/i2=1/\mathrm{hFE}$$

where hFE is the current amplification factor of the parasitic bipolar transistor 4. As described above, since the current amplification factor hFE of this parasitic bipolar transistor 4 is reduced to about 0.05 or less, most of the power accumulated in the capacitive component of the load can be collected.

In the above method, however, an buried diffusion layer 23, epitaxial layer 22, insulating isolation layer 21 and the like need to be provided within the chip of the driving semiconductor device 2 to increase the power collection efficiency by reducing the current amplification factor hFE of the parasitic bipolar transistor 4. Therefore, there is a problem that the driving semiconductor device 2 to be used requires a complicated fabricating process.

It has been proposed that as shown in FIG. 13, the current flowing to the ground potential 12 is eliminated by inserting a switching element 71 between the low potential side power terminal 11 of the driving semiconductor device 2 and the ground potential 12 and keeping the switching element 71 off during the discharge process and substantially all the power charged to the capacitive load is collected irrespective of the current amplification factor hFE of the parasitic bipolar transistor 4 (Japanese Patent Laid-Open Publication HEI 10-335726). In this method, however, control of the high-voltage CMOS output transistor controlled by the low-voltage CMOS control circuit becomes unreliable because the low potential side power supply of the low-voltage CMOS control circuit is also separated from the ground potential 12 when the switching element 71 is turned off. Therefore, this method cannot be employed in practice.

SUMMARY OF THE INVENTION

Accordingly, an object of the present invention is to provide a display device provided with a display panel having a capacitive load such as an ELDP or PDP and a semiconductor device for driving the capacitive load which can reliably operate, collect substantially all the power charged in the capacitive load irrespective of the current amplification factor of a parasitic bipolar transistor and be fabricated by a simple fabricating process.

In order to achieve the above object, the display device of the present invention provides a display device comprising:

a display panel having a capacitive load, and a semiconductor device having a high potential side power terminal to which a high potential is applied, a low potential side power terminal to which a low potential is applied, a power charge/discharge terminal to which a pulsed driving waveform changing between the high potential and the low potential is applied and an output terminal to which the capacitive load is connected, the semiconductor device functioning to generate an output responsive to the driving waveform to the output terminal to thereby drive the capacitive load, wherein the semiconductor device comprises a first p-channel MOS transistor having a source connected to the power charge/discharge terminal, a drain connected to the output terminal, a backgate connected to the high potential side power terminal, and a gate to which a first control signal indicating that the first p-channel MOS transistor should be turned on during an output period in which the capacitive load is to be charged and discharged is applied.

In the display device of the present invention, the first control signal is set at a low (L) level during the output period when the capacitive load needs to be charged and discharged. Consequently, a first p-channel MOS transistor is turned on. Therefore, the charge current flows from the power charge/discharge terminal to the capacitive load through the first p-channel MOS transistor in the ON state and the output terminal during the rise process of the driving waveform. On the other hand, the discharge current flows from the capacitive load to the power charge/discharge terminal through the output terminal and the first p-channel MOS transistor in the ON state during the fall process of the driving waveform. In the semiconductor device, for example, when a first p-channel MOS transistor is provided on a semiconductor substrate with which a low potential side power terminal is in conduction, by a common CMOS circuit fabricating process, there is generated a parasitic bipolar transistor using the source and the backgate of the first p-channel MOS transistor and the semiconductor substrate as its emitter, base and collector, respectively. However, since the potential of the power charge/discharge terminal to which the source of the first p-channel MOS transistor is connected is lower than the potential of the high potential side power terminal to which the backgate of the first p-channel MOS transistor is connected during the fall process of the driving waveform, the emitter and the base of the parasitic bipolar transistor are reverse-biased. Therefore, the discharge current is not drawn even in part to the low potential side power terminal through such a parasitic bipolar transistor. Thus, substantially all the power charged in the capacitive load is collected through the power charge/discharge terminal irrespective of the current amplification factor of the parasitic bipolar transistor. Also, since a buried diffusion layer or the like for reducing the current amplification factor of the parasitic bipolar transistor is not required inside the chip as a result, the semiconductor device can be fabricated by a simple fabricating process. Also, since the low potential side power terminal can be connected to the ground potential at all times, operation of the control circuit never becomes unreliable even in the case where a control circuit for controlling the ON/OFF state of the first p-type MOS transistor is provided on the semiconductor substrate.

In one embodiment, the semiconductor device comprises a second n-type MOS transistor having a source connected to the power charge/discharge terminal, a drain connected to the output terminal, and a gate to which a second control signal opposite in phase to the first control signal is applied.

In the display device of this embodiment, the first control signal is set at a low (L) level while the second control signal is set at a high (H) level during the output period when the capacitive load needs to be charged and discharged. Consequently, not only the first p-channel MOS transistor is turned on but also the second n-type MOS transistor in parallel with the first p-channel MOS transistor is turned on. As a result, the on-resistance of the charge/discharge path is kept low even when the potential of the power charge/discharge terminal changes depending on the driving waveform. Therefore, the power collection efficiency is increased.

In another embodiment, the semiconductor device comprises a third n-type MOS transistor having a source connected to the low potential side power terminal, a drain connected to the output terminal, and a gate to which a third control signal in the same phase with that of the first control signal is applied.

In the display device of this embodiment, the third control signal is set at a low (L) level during the output period when the capacitive load needs to be charged and discharged. Therefore, the third n-type MOS transistor is turned off and does not contribute to the charge/discharge operation through the output terminal. On the other hand, the third control signal is set at a high (H) level during the halt period when the capacitive load is not charged or discharged. Therefore, the third n-type MOS transistor is turned on and the potential of the output terminal is kept low and stable during the halt period.

In another embodiment, the first control signal and the third control signal are given by an identical signal.

In the display device of this embodiment, since the same signal is used as the first control signal and the third control signal, control becomes easy and the configuration of the control circuit is simplified.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
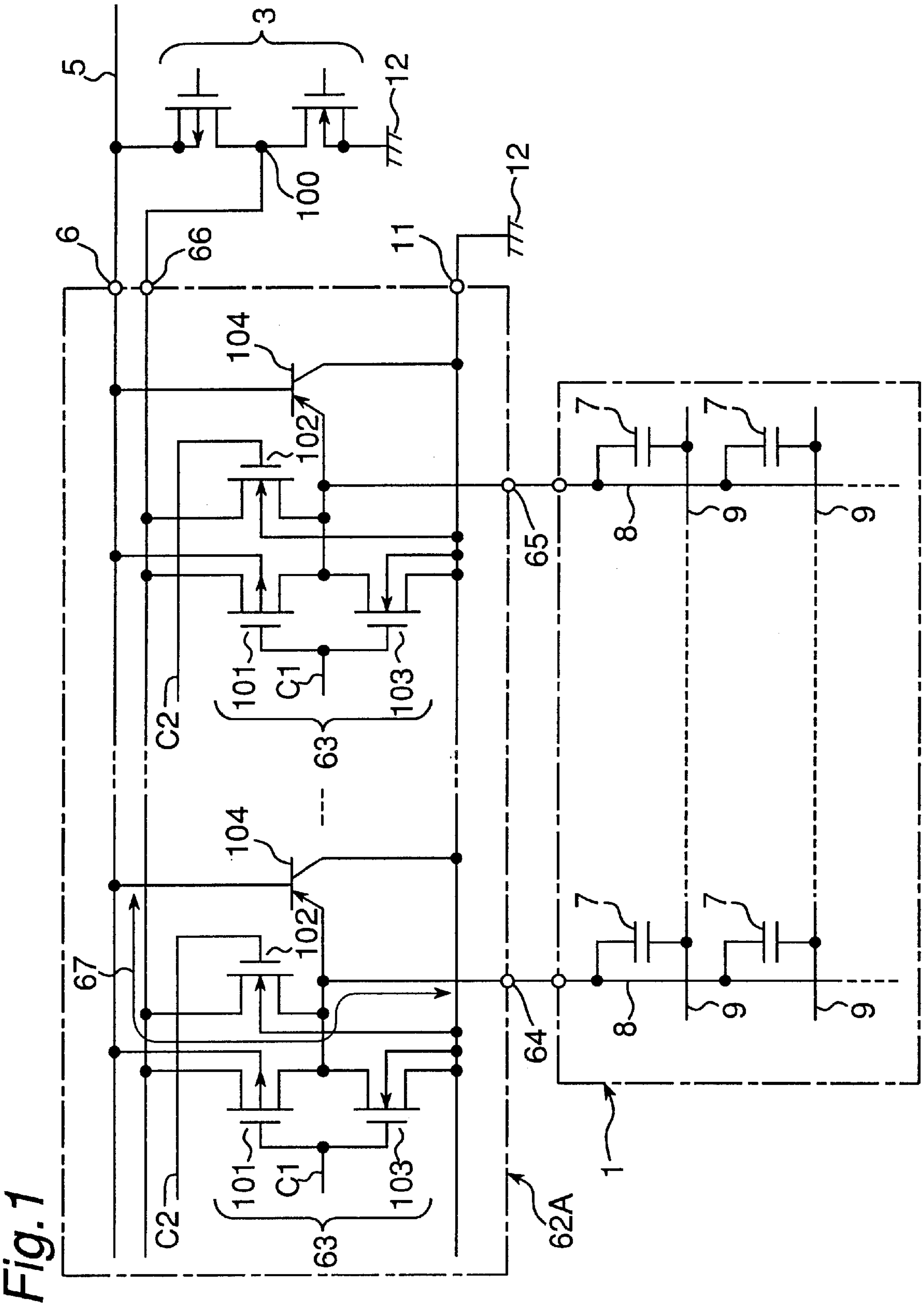
FIG. 1 is a view showing the configuration of an embodiment of the invention having an ELDP and a driving semiconductor device.

The display device of the present invention will be described in detail below with reference to the embodiments shown in the drawings.

Figure 10:
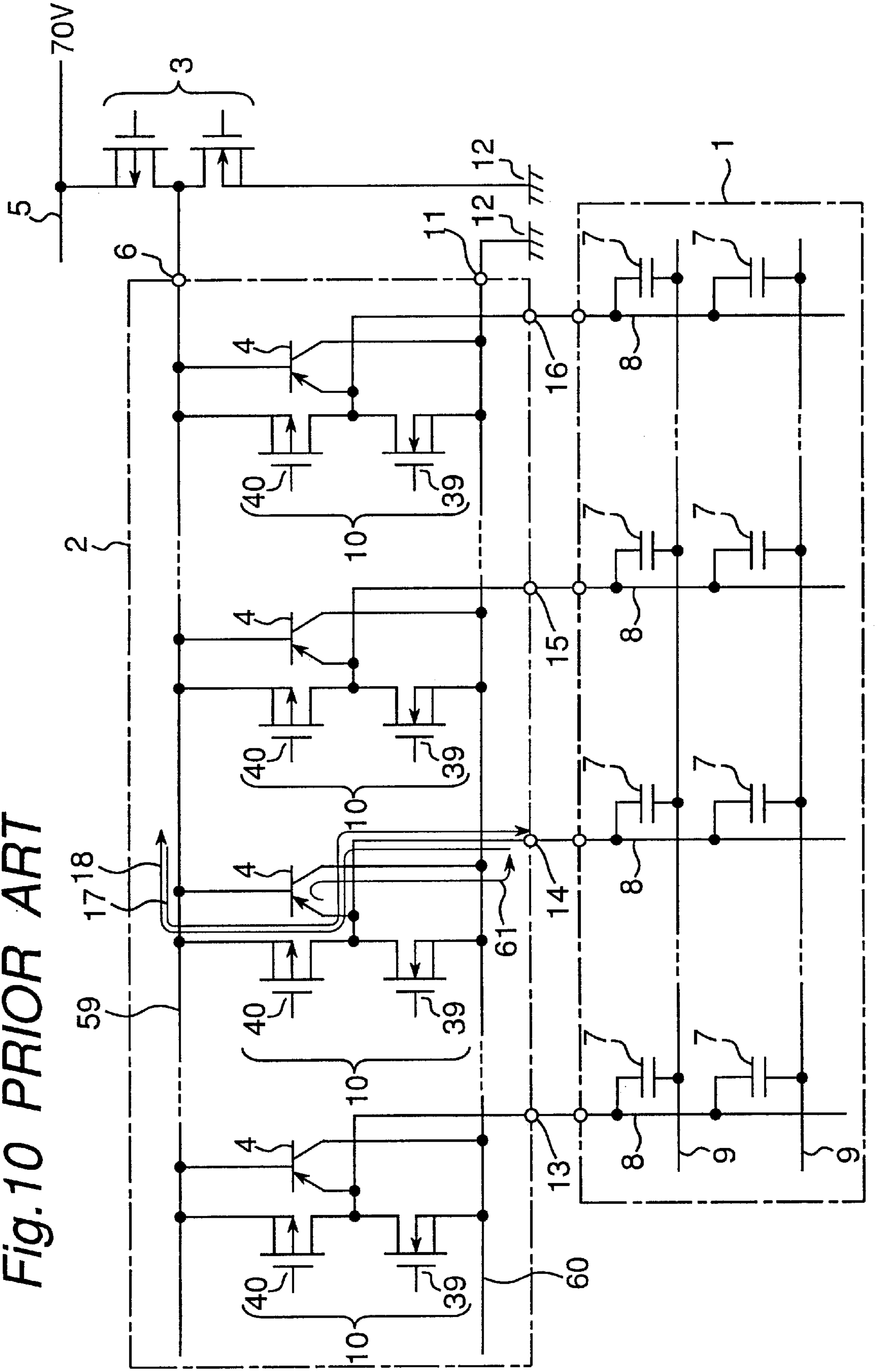
Fig. 10 PRIOR ART
FIG. 10 is a view showing the configuration of a conventional display device having an ELDP and a driving semiconductor device.
Figure 11:
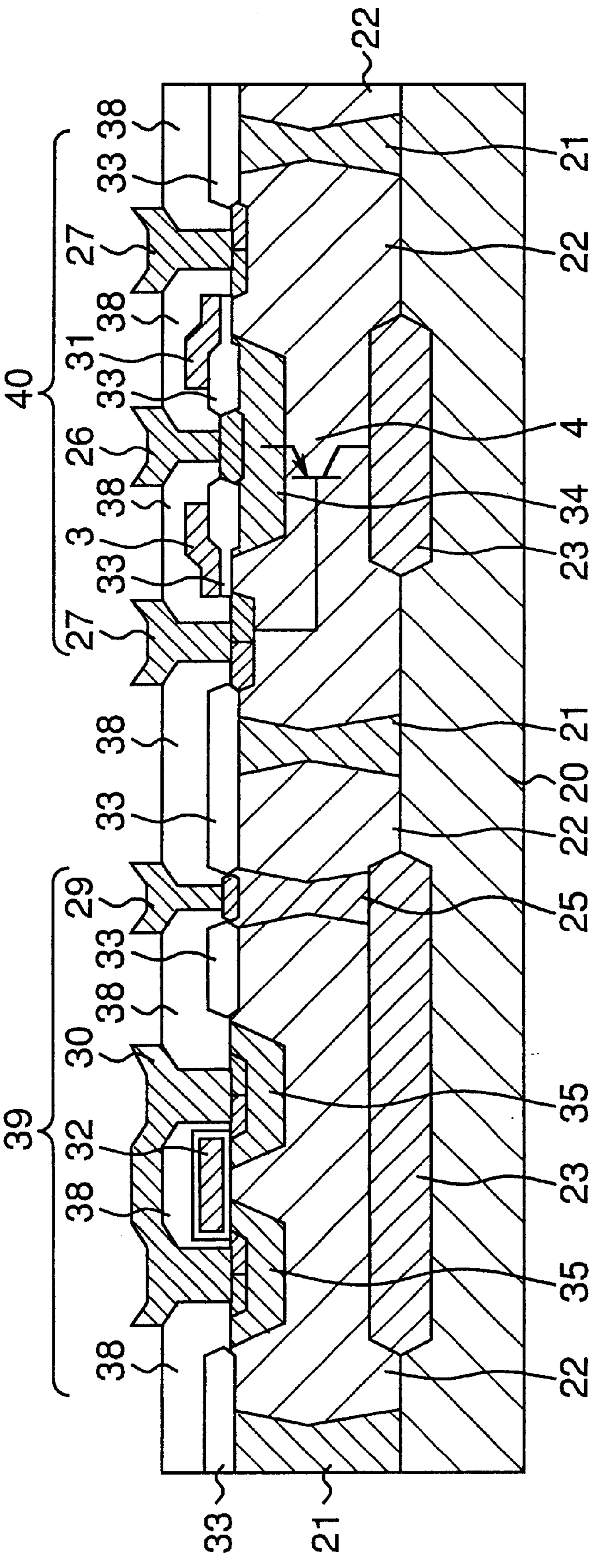
Fig.11 PRIOR ART
FIG. 11 is a view showing a cross-sectional structure of a high voltage CMOS circuit constituting an output stage of the above driving semiconductor device.
Figures 12A, 12B, 12C, 12D:
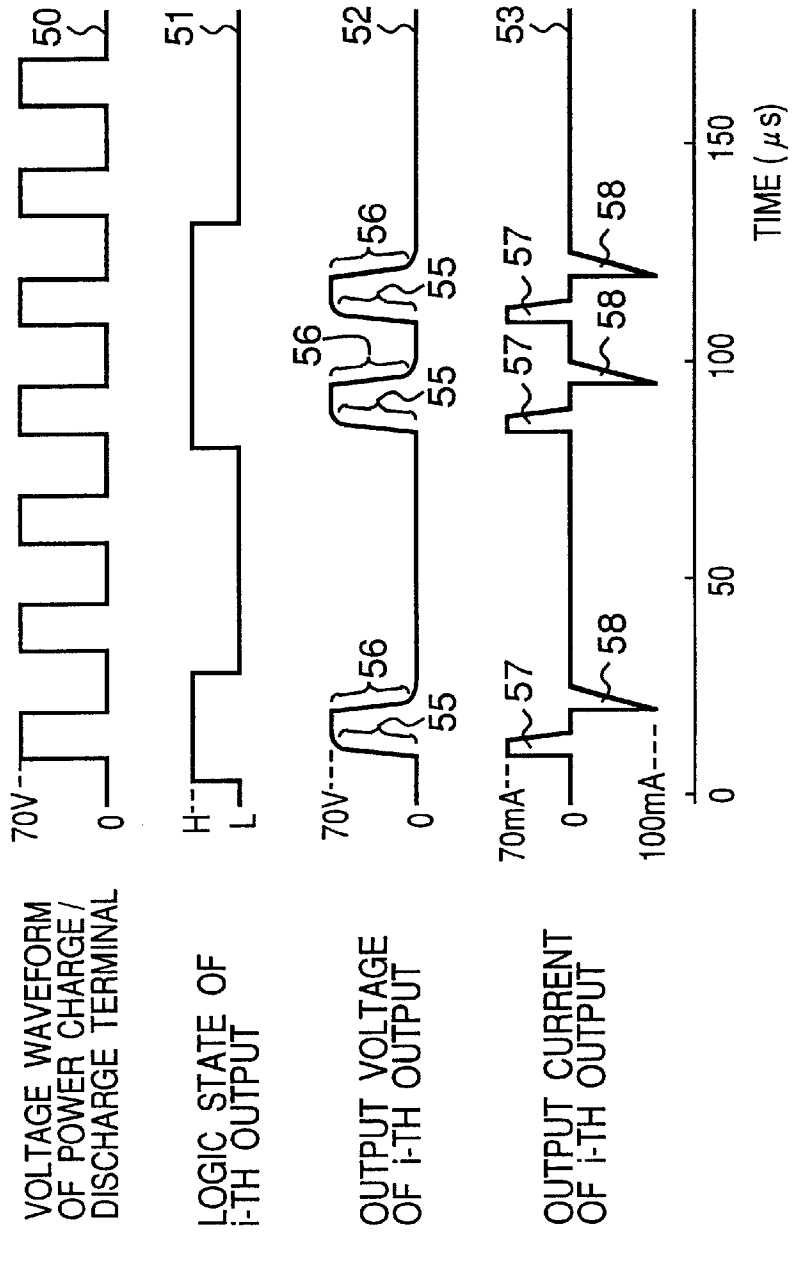
Fig.12A PRIOR ART
Fig.12B PRIOR ART
Fig.12C PRIOR ART
Fig.12D PRIOR ART
FIGS. 12A, 12B, 12C and 12D are views showing waveforms of respective parts of the driving semiconductor device of FIG. 10.
Figure 13:
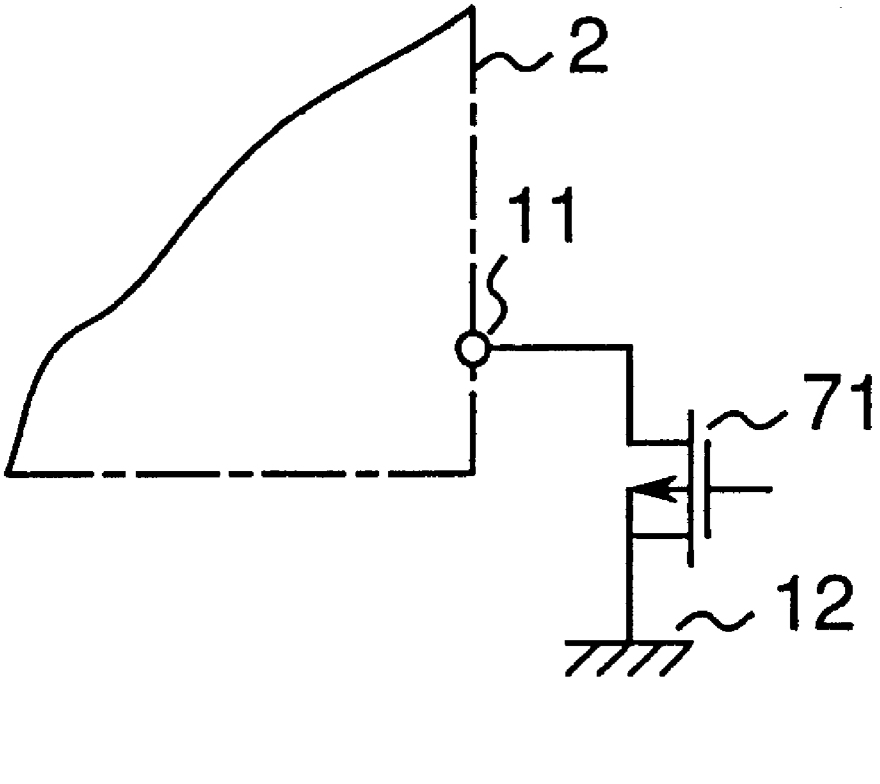
Fig.13 PRIOR ART
FIG. 13 is a view illustrating a known proposal for the display device of FIG. 10.

FIG. 1 shows a configuration of the display device of an embodiment having an ELDP 1 and a driving semiconductor device 62A. The driven ELDP 1 and the power supply voltage control circuit 3 are the same as those shown in FIG. 10. There is provided a known power collecting circuit for collecting power in the power supply voltage control circuit 3 although it is not shown in the figure. The specific explanation of the power collecting circuit is omitted because the power collecting circuit is not directly related to the present invention.

A few tens of high voltage CMOS circuits 63 constituting output stages are arranged in an array and a high potential side power terminal 6, low potential side power terminal 11, power charge/discharge terminal 66 and output terminals 64, 65, . . . each corresponding to each of the high voltage CMOS circuits 63 are provided on a semiconductor chip constituting a driving semiconductor device 62A. Each high voltage CMOS circuit 63 has a first PMOS transistor 101 and a third NMOS transistor 103 for a high voltage specification, which are connected in series. There is provided a second NMOS transistor 102 in parallel with the first PMOS transistor 101. Specifically, in the first PMOS transistor 101, the source is connected to the power charge/discharge terminal 66, the drain is connected to the output terminal 64 and the backgate is connected to the high potential side power terminal 6. In the second NMOS transistor 102, the source is connected to the power charge/discharge terminal 66, the drain is connected to the output terminal 64 and the backgate is connected to the low potential side power terminal 11. In the third NMOS transistor 103, the source is connected to the low potential side power terminal 11, the drain is connected to the output terminal 64 and the backgate is connected to the low potential side power terminal 11. A first control signal C1 is commonly applied to the gate of the first PMOS transistor 101 and the gate of the third NMOS transistor 103 while a second control signal C2 is applied to the gate of the second NMOS transistor 102. These first control signal C1 and second control signal C2 are outputted by a low-voltage CMOS control circuit, which is not shown in the figure, such as a shift-register circuit or latch circuit mounted on the same chip. It is noted that since the ON/OFF state of the first PMOS transistor 101 and that of the third NMOS transistor 103 are controlled by the same control signal C1, control becomes easy and the configuration of the low-voltage CMOS control circuit is simplified.

A high potential (DC 70 V) is applied to the high potential side power terminal 6 from a high-voltage constant voltage power supply 5. Also, the low potential side power terminal 11 is connected to the ground potential 12, which has a low potential, and is in conduction with a semiconductor substrate. A pulsed driving waveform, which changes between a high potential (DC 70 V) and the ground potential 12, is applied to the power charge/discharge terminal 66 from the output part 100 of the power supply voltage control circuit 3. Each of the output terminal 64, 65, . . . is connected to each electrode 8 in the vertical direction having a capacitive load 7 in the ELDP 1.

Figure 3:
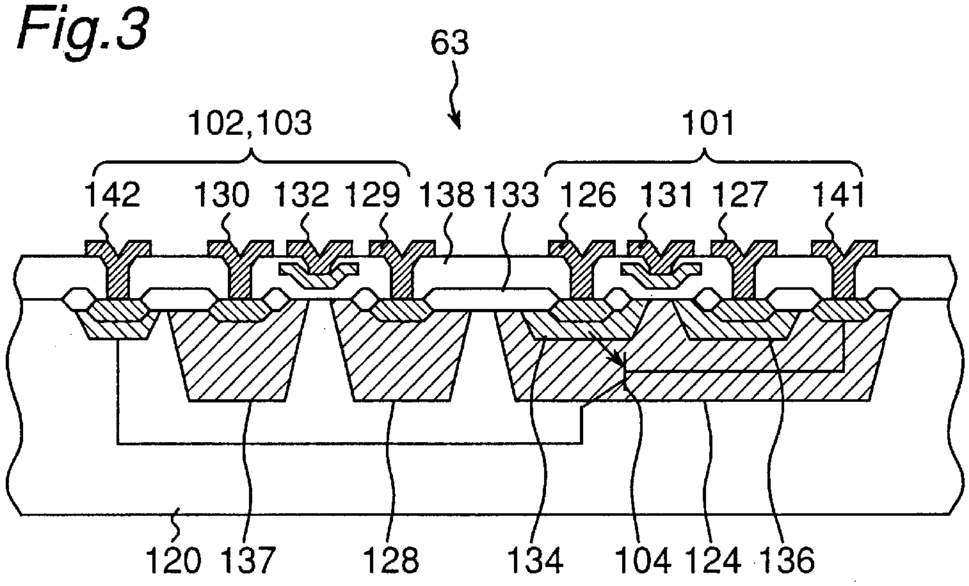
FIG. 3 is a view showing a cross-sectional structure of a high voltage CMOS circuit constituting an output stage of the above driving semiconductor device.

As shown in FIG. 3, the high voltage CMOS circuit 63 in the output stage is fabricated by the most simple fabricating process that is generally known. That is, an n-type well diffusion layer 124 is formed on the surface of a p-type semiconductor substrate 120 and a first PMOS transistor 101 is formed in this n-type well diffusion layer 124. On the other hand, the second and third NMOS transistors 102, 103 have the same structure and are formed directly on the surface of the p-type semiconductor substrate 120. As a result, the first PMOS transistor 101 is electrically isolated from the second and third NMOS transistors 102, 103 by the n-type well diffusion layer 124. It is noted that a low-voltage control circuit is also formed in the same semiconductor substrate 120 in a state that it is electrically isolated by an n-type well diffusion layer similar to the n-type well diffusion layer 124. The first PMOS transistor 101 has a horizontal-type structure having a p-type drain diffusion layer 134 and a p-type source diffusion layer 136 for a high voltage specification and comprises a source electrode 126, drain electrode 127, gate electrode 131 and backgate electrode 141. The second and third NMOS transistors 102, 103 have a horizontal-type structure having an n-type drain diffusion layer 128 and an n-type source diffusion layer 137 for a high voltage specification and comprise a source electrode 130, drain electrode 129, gate electrode 132 and backgate electrode 142. 133 denotes an oxide film and 138 denotes a surface insulating film. In this structure, there is generated a parasitic bipolar transistor 104 using the source 134 of the first PMOS transistor 101, n-type well diffusion layer (backgate) 124 and semiconductor substrate 120 as its emitter, base and collector (also shown in FIG. 1). The current amplification factor hFE of this parasitic bipolar transistor 104 is usually about 10–100.

Figures 2A, 2B, 2C, 2D, 2E, 2F, 2G:
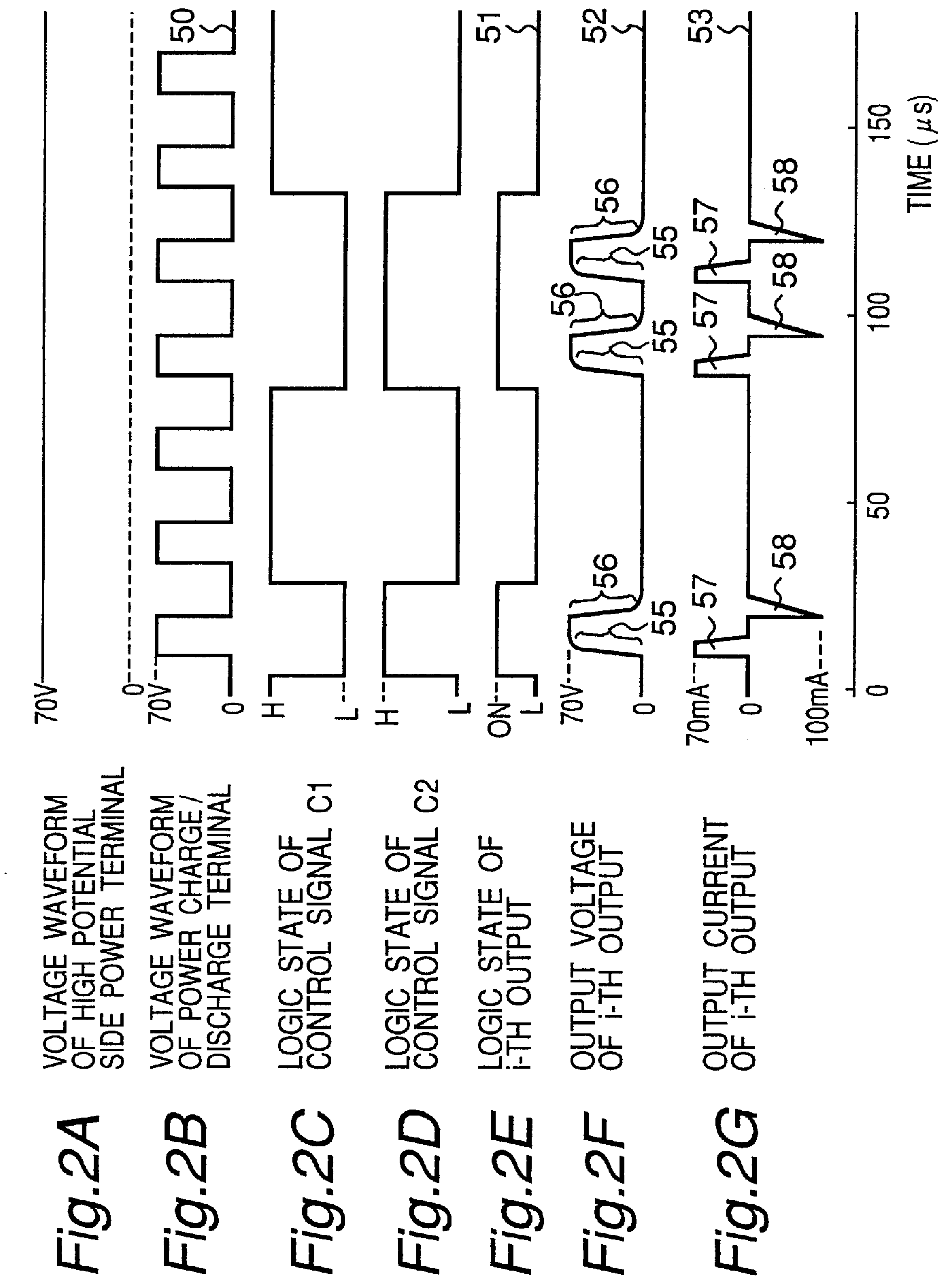
FIGS. 2A, 2B, 2C, 2D, 2E, 2F and 2G are views showing waveforms of respective parts of the driving semiconductor device of FIG. 1.

FIGS. 2A, 2B, 2C, 2D, 2E, 2F and 2G show waveforms of respective parts in the driving semiconductor device 2. In this example, a periodic rectangular wave 50 (see FIG. 2B) is applied to the power charge/discharge terminal 66 by the power supply voltage control circuit 3. The voltage of the i-th output terminal (exemplified by the one with reference numeral 64 for convenience) out of the output terminals 64, 65, . . . is controlled by the periodic rectangular wave 50 applied to the power charge/discharge terminal 66 and the logic state 51 (see FIG. 2E) of the i-th output CMOS circuit 63 determined by image information (an H level represents an output; an L level represents a halt) and has a waveform 52 showing integrated rises and falls due to the capacitive load. In FIG. 2F, 55 represents charge process to the load and 56 represents discharge process from the load. In FIG. 2G, 53 is a current waveform in the i-th output terminal 64. The positive direction represents output from the output terminal 64. 57 represents charge current to an electrode 8 in the vertical direction corresponding to the i-th output terminal 64. 58 represents discharge current from the electrode 8 in the vertical direction corresponding to the i-th output terminal 64.

The first control signal C1 is set at the L level and the second control signal C2 is set at the H level during the output period when the capacitive load 7 needs to be charged and discharged. Consequently, the first PMOS transistor 101 is turned on while the second NMOS transistor 102 in parallel with the first PMOS transistor 101 is also turned on. On the other hand, the third NMOS transistor 103 is turned off. Therefore, the charge current 57 flows through a path shown as 67 in FIG. 1 during the rise process of the driving waveform, that is, from the power charge/discharge terminal 66 to the electrode 8 in the vertical direction through the first PMOS transistor 101 and the second NMOS transistor 102, which are in the ON state, and then the output terminal 64. Thus, the capacitive load 7 is charged. On the other hand, the discharge current 58 flows through the path in the direction reverse to that of the charge during the fall process of the driving waveform, that is, from the capacitive load 7 to the power charge/discharge terminal 66 through the output terminal 64 and then the first PMOS transistor 101 and second NMOS transistor 102, which are in the ON state. The aforementioned parasitic bipolar transistor 104 exists below the first PMOS transistor 101, but the emitter and the base of the parasitic bipolar transistor 104 are reverse-biased because the potential of the power charge/discharge terminal 66 to which the source 126 of the first PMOS transistor 101 is connected is lower than the potential of the high potential side power terminal 6 to which the p-type well diffusion layer 124 i.e., backgate 124 is connected via the backgate electrode 141 during the fall process of the driving waveform. Therefore, the discharge current 58 does not flow even in part to the low potential side power terminal 11 through such a parasitic bipolar transistor 104. Thus, substantially all the power charged to the capacitive load 7 is collected through the power charge/discharge terminal 66 irrespective of the current amplification hFE of the parasitic bipolar transistor 104.

Also, since not only the first PMOS transistor 101 is in the ON state, but also the second NMOS transistor 102 in parallel with the first PMOS transistor 101 is in the ON state during the output period, the on-resistance of the charge/discharge path 67 is kept low even if the potential of the power charge/discharge terminal 66 changes depending on the driving waveform. Therefore, the power collection efficiency can be increased.

It is noted that the collected power is temporarily stored and used for the charge during the next rise of the driving waveform.

During the halt period when the capacitive load 7 is not charged or discharged, the first control signal C1 is set at the H level and the second control signal C2 is set at the L level. Consequently, the first PMOS transistor 101 and the second NMOS transistor 102 are turned off while the third NMOS transistor 103 is turned on. Therefore, the charge/discharge path 67 is disconnected and the potential of the output terminal 64 is kept low and stable.

Figure 5:
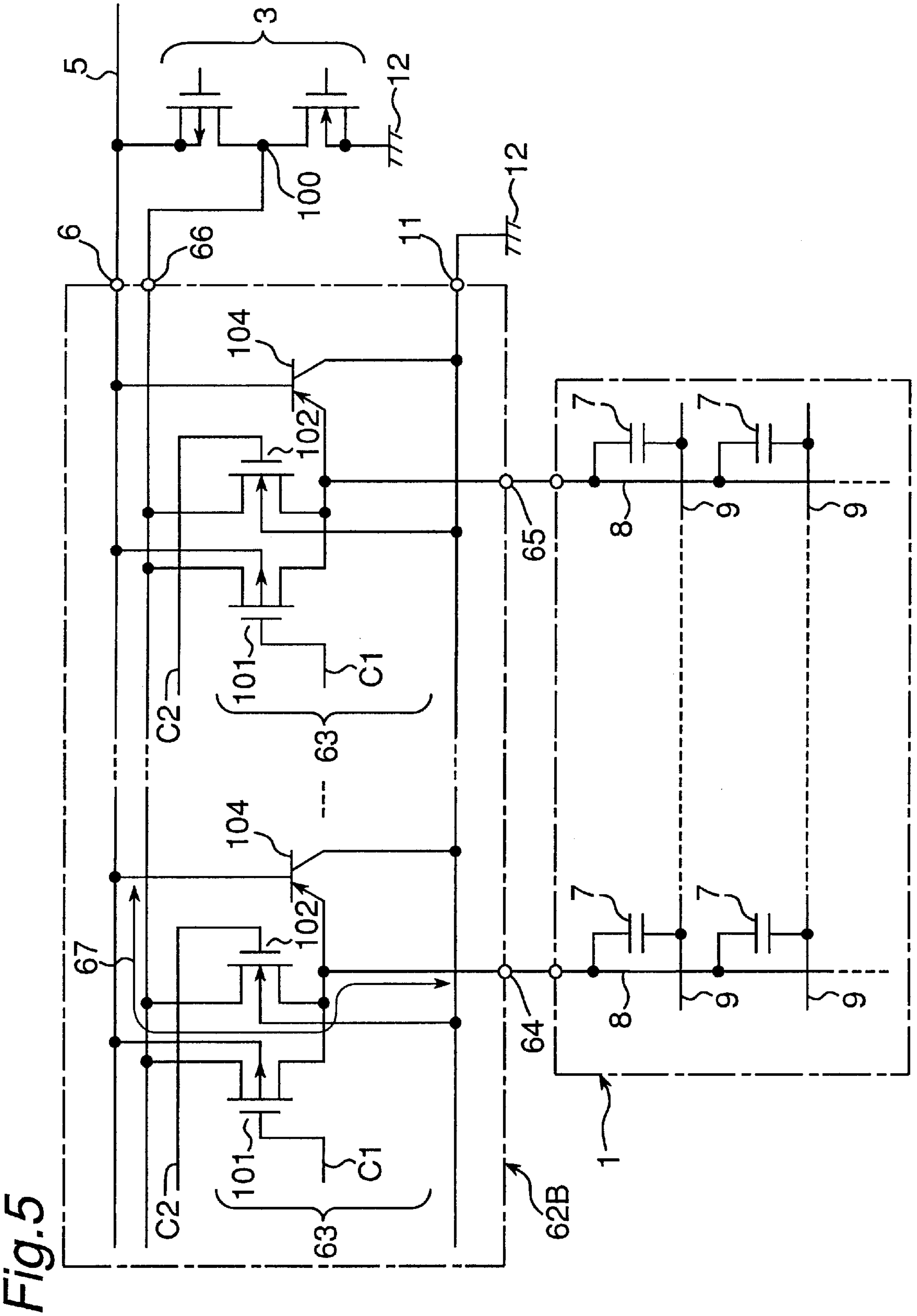
FIG. 5 is a view illustrating a modification of the driving semiconductor device of FIG. 1.
Figure 6:
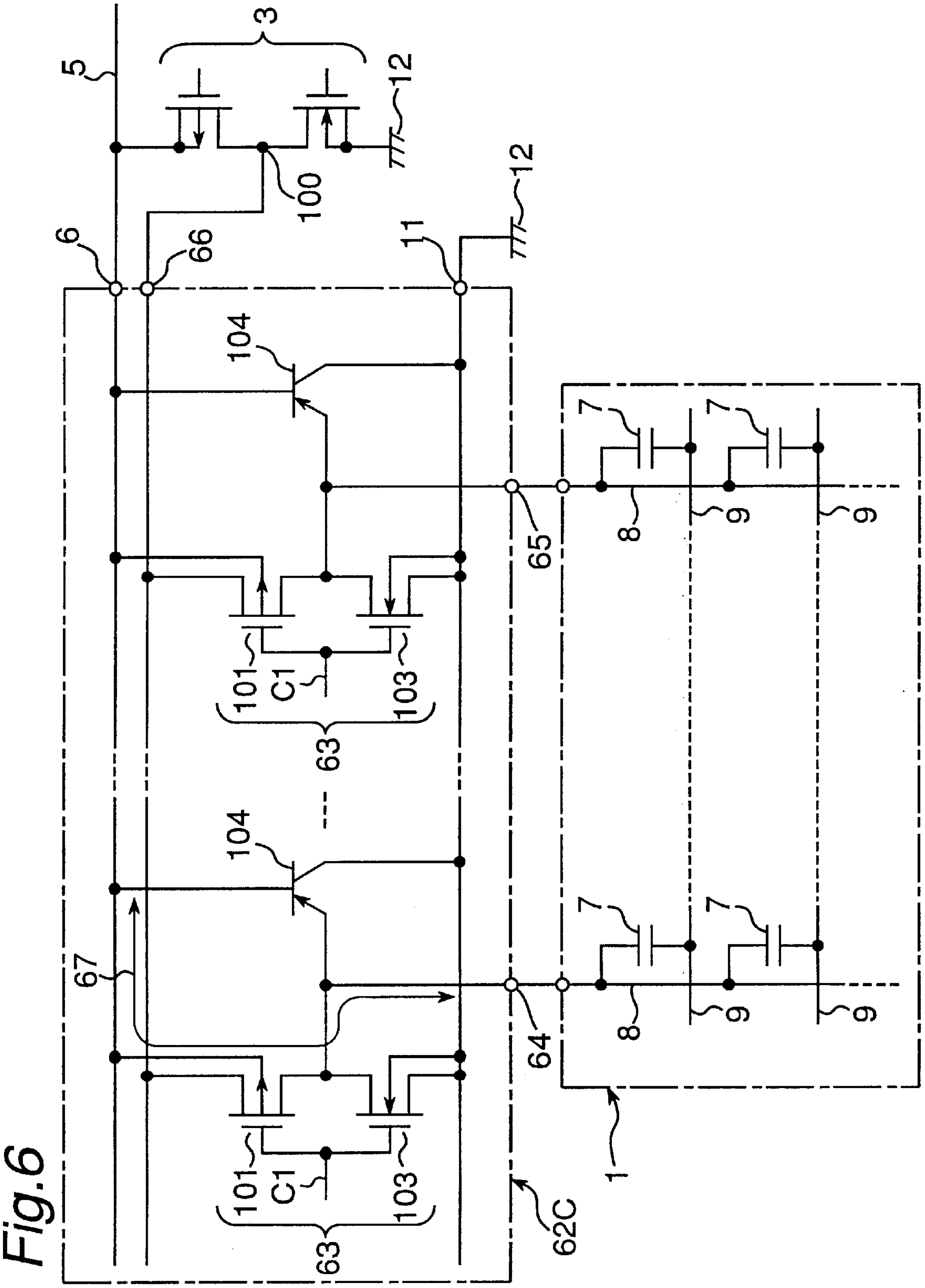
FIG. 6 is a view illustrating another modification of the driving semiconductor device of FIG. 1.
Figure 7:
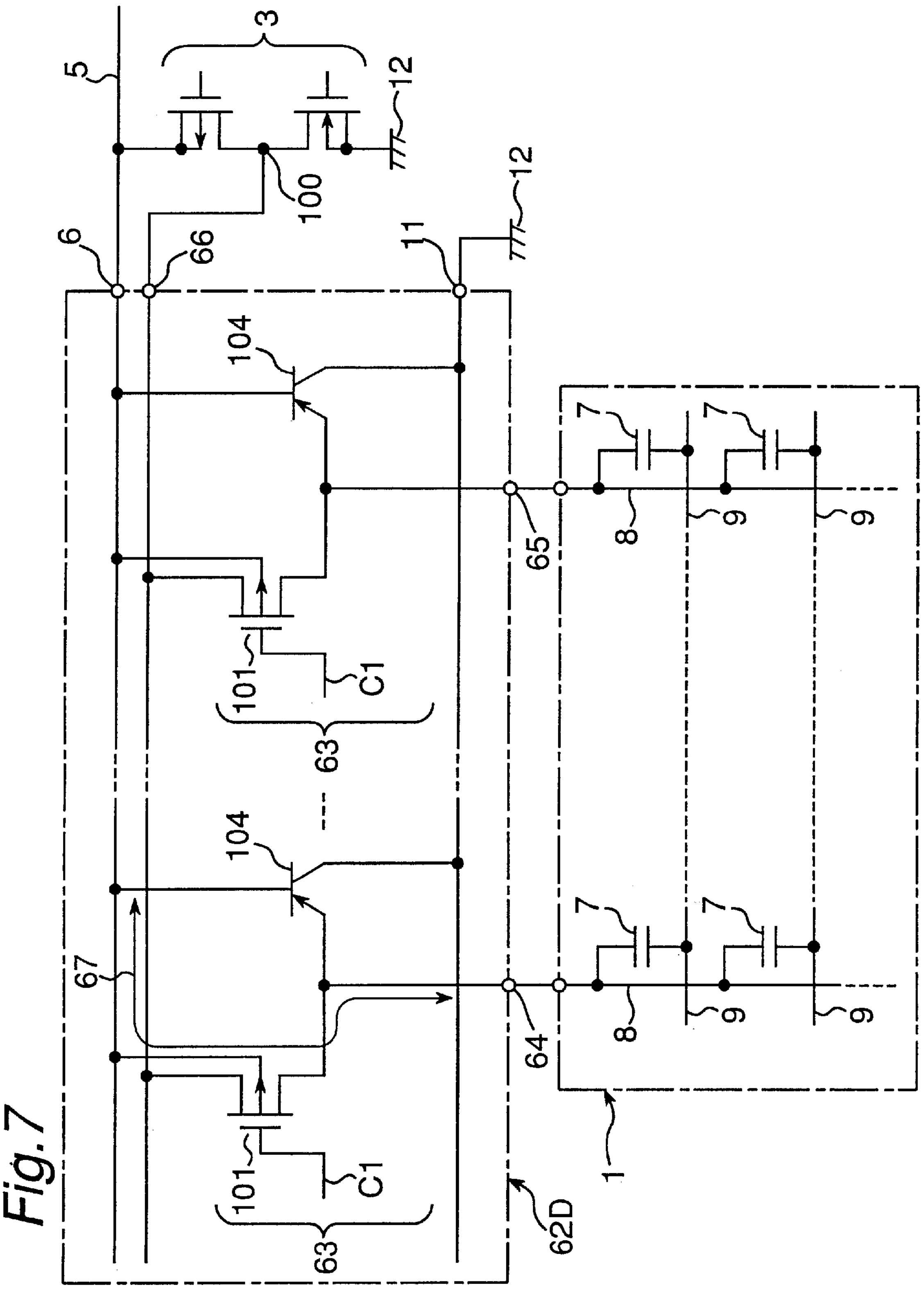
FIG. 7 is a view illustrating another modification of the driving semiconductor device of FIG. 1.

As a driving semiconductor device 62B shown in FIG. 5, however, the third NMOS transistor 103 can be omitted to simplify the configuration of the output stage. This is because the third n-type MOS transistor 103 is in the OFF state during the output period and does not contribute to the ON/OFF operation described above. Also, as a driving semiconductor device 62C shown in FIG. 6, the second NMOS transistor 102 may be omitted to simplify the configuration of the output stage. Also, as a driving semiconductor device 62D shown in FIG. 7, the second NMOS transistor 102 and the third NMOS transistor 103 may be omitted to further simplify the configuration of the output stage.

Figure 8:
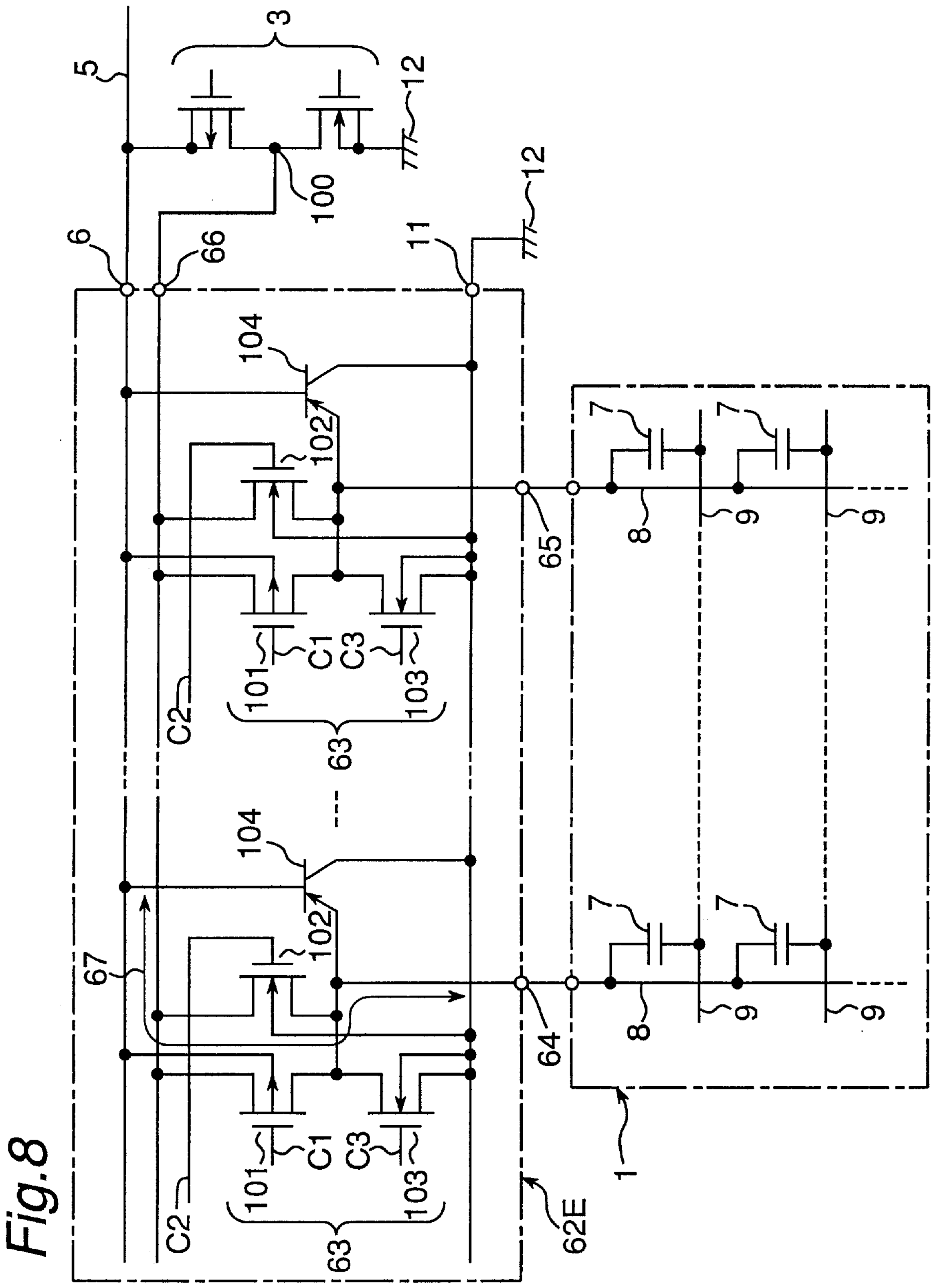
FIG. 8 is a view illustrating another modification of the driving semiconductor device of FIG. 1.
Figure 9:
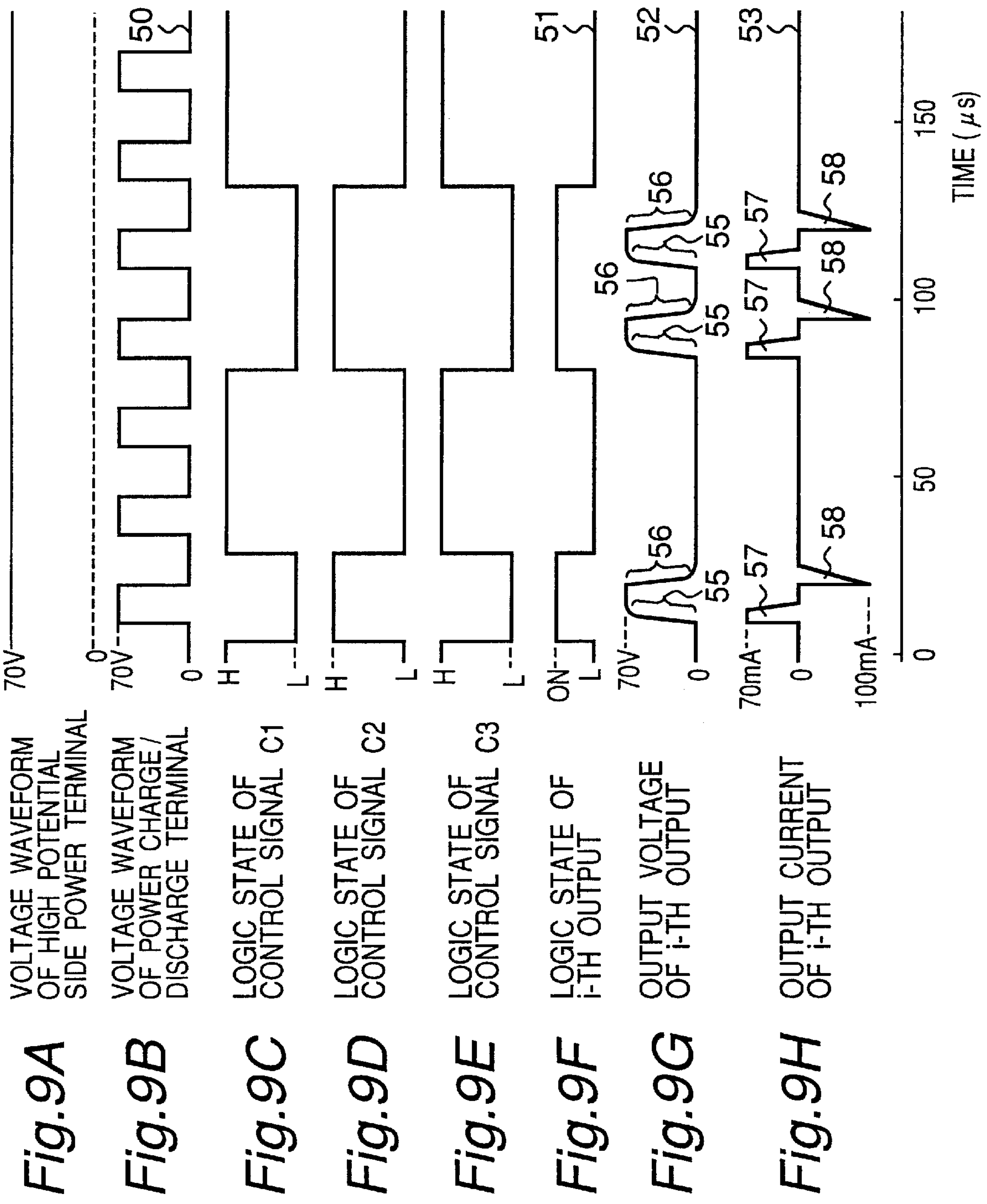
FIGS. 9A, 9B, 9C, 9D, 9E, 9F, 9G and 9H are views showing waveforms of respective parts of the driving semiconductor device of FIG. 8.

Also, as a driving semiconductor device 62E shown in FIG. 8, the gate of the first PMOS transistor 101 and the gate of the third NMOS transistor 103 may be separated and the first control signal C1 and the third control signal C3 may be applied to the gate of the first PMOS transistor 101 and the gate of the third NMOS transistor 103, respectively. In this case, the third control signal C3 to be applied is in the same phase with that of the first control signal Cl as shown in FIGS. 9C and 9D. FIGS. 9A, 9B, 9C, 9D, 9E, 9F, 9G and 9H show waveforms of respective parts of the driving semiconductor device 62E.

It is noted that since the low potential side power terminal 11 is connected to the ground potential 12 at all times, operation of the low-voltage CMOS control circuit (not shown) provided on the semiconductor substrate 120 never becomes unreliable.

Figure 4A:
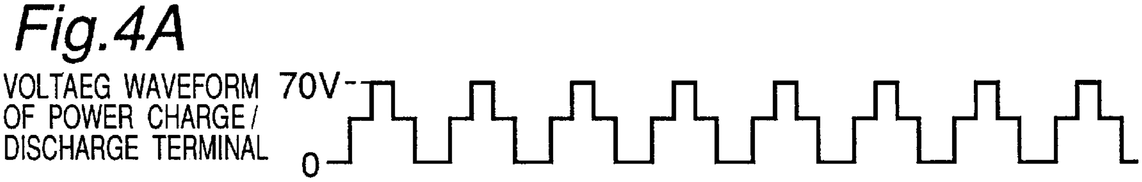
FIGS. 4A and 4B are views exemplifying waveforms of voltages which can be applied to a power charge/discharge terminal by a power supply voltage control circuit.
Figure 4B:

In the example described above, a rectangular wave 50 as shown in FIG. 2 is applied to the power charge/discharge terminal 66 by the power supply voltage control circuit 3, but waveforms to be applied are not limited to this. A periodic step waveform shown in FIG. 4A or a periodic sawtooth waveform shown in FIG. 4B may be applied.

It is needless to say that the display device of the present invention can be applied to those provided with various display panels having a capacitive load other than an ELDP.

As is evident from the above, since, in the display device of the present invention, the semiconductor device for driving the display panel has a first p-channel MOS transistor in which the source is connected to the power charge/discharge terminal, the drain is connected to the output terminal and the backgate is connected to the high potential side power terminal and a first control signal indicating that the transistor should be turned on during the output period when the capacitive load needs to be charged and discharged is applied to the gate, the discharge current is not drawn even in part to the low potential side power terminal through the parasitic bipolar transistor. Therefore, substantially all the power charged to the capacitive load can be collected through the power charge/discharge terminal irrespective of the current amplification factor of the parasitic bipolar transistor. Also, as a result, a buried diffusion layer or the like for reducing the current amplification factor of the parasitic bipolar transistor is not required in the chip. Thus, this semiconductor device can be fabricated by a simple fabricating process. Also, since the low potential side power terminal can be connected to the ground potential at all times, operation of the control circuit never becomes unreliable even in the case where a control circuit for controlling the ON/OFF state of the first p-channel MOS transistor is integrally formed on the semiconductor substrate.

In one embodiment, the semiconductor device has a second n-type MOS transistor in which the source is connected to the power charge/discharge terminal, the drain is connected to the output terminal and a second control signal in opposite phase to the first control signal is applied to the gate. In this case, the on-resistance of the charge/discharge path can be kept low even if the potential of the power charge/discharge terminal changes depending on the driving waveform. Therefore, the power collection efficiency can be increased.

In one embodiment, the semiconductor device has a third n-type MOS transistor in which the source is connected to the low potential side power terminal and the drain is connected to the output terminal and the third control signal in the same phase with that of the first control signal is applied to the gate. In this case, the potential of the output terminal can be low and stable during the halt period when the capacitive load is not charged or discharged.

Since the first control signal and third control signal are the same signals in the display device of another embodiment, the control becomes easy. Also, the configuration of the control circuit can be simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display device comprising:

a display panel having a capacitive load, and a semiconductor device having a high potential side power terminal to which a high potential is applied, a low potential side power terminal to which a low potential is applied, a power charge/discharge terminal to which a pulsed driving waveform changing between the high potential and the low potential is applied and an output terminal to which the capacitive load is connected, the semiconductor device functioning to generate an output responsive to the driving waveform to the output terminal to thereby drive the capacitive load, wherein the semiconductor device comprises a first p-channel MOS transistor having a source connected to the power charge/discharge terminal, a drain connected to the output terminal, a backgate connected to the high potential side power terminal, and a gate to which a first control signal indicating that the first p-channel MOS transistor should be turned on during an output period in which the capacitive load is to be charged and discharged is applied.

2. The display device according to claim 1, wherein the semiconductor device comprises a second n-type MOS transistor having a source connected to the power charge/discharge terminal, a drain connected to the output terminal, and a gate to which a second control signal opposite in phase to the first control signal is applied.

3. The display device according to claim 2, wherein the semiconductor device comprises a third n-type MOS transistor having a source connected to the low potential side power terminal, a drain connected to the output terminal, and a gate to which a third control signal in the same phase with that of the first control signal is applied.

4. The display device according to claim 3, wherein the first control signal and the third control signal are given by an identical signal.

5. The display device according to claim 1, wherein the semiconductor device comprises a third n-type MOS transistor having a source connected to the low potential side power terminal, a drain connected to the output terminal, and a gate to which a third control signal in the same phase with that of the first control signal is applied.

6. The display device according to claim 5, wherein the first control signal and the third control signal are given by an identical signal.

* * * * *